United States Patent [19]
Ohba et al.

[11] Patent Number: 5,734,181
[45] Date of Patent: Mar. 31, 1998

[54] SEMICONDUCTOR DEVICE AND MANUFACTURING METHOD THEREFOR

[75] Inventors: Ryuji Ohba, Kawasaki; Tomohisa Mizuno, Yokohama; Makoto Yoshimi, Setagaya-Ku; Kazuya Ohuchi, Yokohama, all of Japan

[73] Assignee: Kabushiki Kaisha Toshiba, Kawasaki, Japan

[21] Appl. No.: 716,713

[22] Filed: Sep. 12, 1996

[30] Foreign Application Priority Data

Sep. 14, 1995 [JP] Japan ............... 7-237347
Mar. 15, 1996 [JP] Japan ............... 8-087724

[51] Int. Cl.$^6$ ............ H01L 31/0312; H01L 29/06; H01L 31/0328; H01L 31/0336
[52] U.S. Cl. ............................ 257/77; 257/24
[58] Field of Search .............. 257/77, 24, 192, 257/194

[56] References Cited

U.S. PATENT DOCUMENTS 5,103,285  4/1992  Furumura et al. ............ 257/77
5,561,302  10/1996  Candelaria ................ 257/24

FOREIGN PATENT DOCUMENTS 53-39293   10/1978  Japan.
2284472    11/1990  Japan.
3-18062    1/1991   Japan.

OTHER PUBLICATIONS

J. Gryko et al., "Energy Band Gaps of Silicon–Carbon Alloys", Physical Review, vol. 51, No. 11, Mar. 1995, pp. 7295–7298.

Primary Examiner—Stephen Meier
Attorney, Agent, or Firm—Foley & Lardner

[57] ABSTRACT

A semiconductor device having a MISFET includes: a silicon substrate (2) having a semiconductor region on a surface thereof; a source region (10a) and a drain region (10b) formed in the semiconductor region separately; a channel region formed in the semiconductor region and between the source region and the drain region; a gate electrode (6) formed on the channel region; and a region (8a) formed of $Si_{1-x}C_x$ overlapping the source region and having a carbon concentration enough to increase an energy gap therein beyond that in the channel region. Further, the MISFET is constructed in such a way that a hetero-junction surface formed between the region formed of $Si_{1-x}C_x$ (8a) and the other portion of the semiconductor region on the side of the channel region exists at an interface between the source region (10a) and the channel region or in the vicinity thereof, in order to realize a high speed operation, even if the device is microminiaturized.

17 Claims, 12 Drawing Sheets

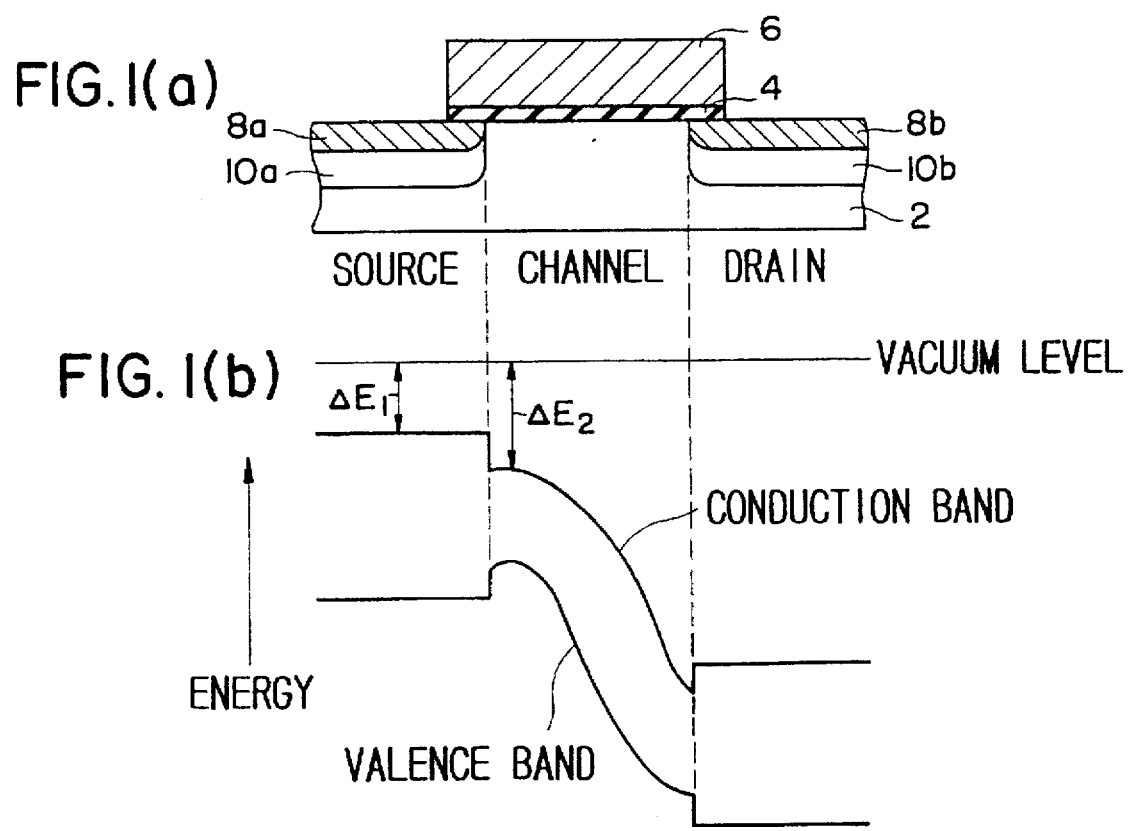

SOURCE | CHANNEL | DRAIN

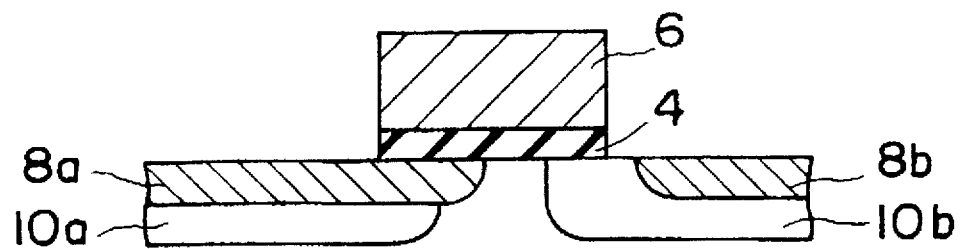
F I G. 6A
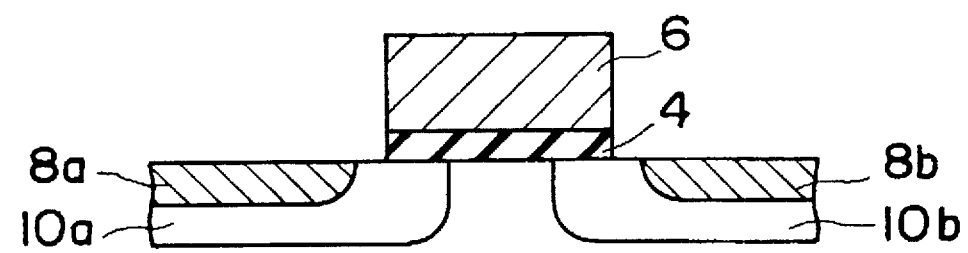
F I G. 6B

SEMICONDUCTOR DEVICE AND MANUFACTURING METHOD THEREFOR

BACKGROUND OF THE INVENTION

1. Field of the Invention

The present invention relates to a semiconductor device and a method of manufacturing the same semiconductor device, and more specifically to a structure of a MISFET (Metal Insulator Semiconductor Field Effect Transistor) having a region formed of $Si_{1-x}C_x$ in a source region or a drain region thereof.

2. Description of the Prior Art

Recently, MOSFETs have been microminiaturized more and more to obtain a higher integration of integrated circuits. In the prior art MOSFET of planar structure, as shown in FIG. 13(a), a source region 10a and a drain region 10b are both formed in a semiconductor substrate 2, and a gate electrode 6 is formed on a surface of the substrate 2 via a gate insulating film 4. Further, FIG. 13(b) shows an energy band of silicon.

In the prior art MOSFET of the planar structure as described above, there exists a problem in that although the electric field in the element can be increased with increasing microminiaturization of the element, a large current driving capability cannot be obtained.

The reason can be explained as follow: the drain current $I_d$ of a MOSFET can be generally expressed as $$I_d = v \cdot W \cdot C_{ox} \cdot (V_g - V_{th})$$

where v denotes the carrier speed; W denotes the gate width; $C_{ox}$ denotes the gate capacitance; $V_g$ denotes the gate voltage; and $V_{th}$ denotes the threshold voltage.

Further, the trans-conductance $G_m$ of the MOSFET can be expressed as $$G_m = v \cdot W \cdot C_{ox}$$

However, since carriers are transported in a steady state, the carrier speed v cannot be increased beyond the carrier saturation speed $v_{sat} = 1 \times 10^7$ cm/s, thus causing a problem in that a large current driving capability cannot be obtained.

In the case of a prior art n-channel MOSFET of SOI (Silicon on insulator) structure, as shown in FIG. 14, on the other hand, the structure is such that a buried oxide film 22 is formed on a substrate 21; a p-type silicon layer 23 is formed on this oxide film 22; an N⁺ type diffusion layer 30a or 30b used as a source or a drain region is formed in this silicon layer 23; a gate oxide film 24 is formed on the silicon layer 23; and a gate electrode 26 is formed on this gate oxide film 24.

In the SOI-MOSFET of prior art structure, since the silicon layer 23 can be depleted completely, there exist such advantages that the carrier mobility can be improved and further the short channel effect can be suppressed markedly due to the shallow n⁺ layer 30a or 30b formed as the source or drain region. In the above-mentioned n-channel MOSFET of SOI structure, however, since holes are generated by impact ionization at the drain end (which is caused by a floating effect in the silicon layer 23), the generated holes tend to be accumulated in the vicinity of the energy barrier of the p-n junction formed on the source side of an interface between the silicon layer 23 and the silicon oxide film 22, a parasitic bipolar transistor composed of an emitter of the source 30a, a base of the silicon layer 23, and a collector of the drain 30b, respectively, is activated due to the above-mentioned accumulated holes, with the result that there exists a problem in that the drain breakdown voltage is lowered.

SUMMARY OF THE INVENTION

With these problems in mind, therefore, it is the object of the present invention to provide a semiconductor device having a MISFET operative at a high speed even if the device is microminiaturized.

Further, the second object of the present invention is to provide a semiconductor device having a MISFET formed on a SOI substrate, which can prevent the drain breakdown voltage from being lowered.

Further, the third object of the present invention is to provide a method of manufacturing a semiconductor device having a MISFET operative at a high speed even if the device is microminiaturized.

Further, the fourth object of the present invention is to provide a method of manufacturing a semiconductor device having a MISFET formed on a SOI substrate, which can prevent the drain breakdown voltage from being lowered.

To achieve the above-mentioned object, a first aspect of the present invention provides a semiconductor device having a metal insulator semiconductor field effect transistor, comprising: a silicon substrate having a semiconductor region on a surface thereof; a source region and a drain region formed in the semiconductor region separately; a channel region formed in the semiconductor region and between the source region and the drain region; a gate electrode formed on the channel region; and a region formed of $Si_{1-x}C_x$ overlapping the source region and having a carbon concentration enough to increase an energy gap therein beyond that in the channel region, and wherein the metal insulator semiconductor field effect transistor is constructed in such a way that a hetero-junction surface formed between the region formed of $Si_{1-x}C_x$ and the other portion of the semiconductor region on the side of the channel region exists at an interface between the source region and the channel region or in the vicinity thereof.

Further, the second aspect of the present invention provides a semiconductor device having: metal insulator semiconductor field effect transistors, comprising: a silicon substrate having a p-type semiconductor region and an n-type semiconductor region on a surface thereof; an n-channel metal insulator semiconductor field effect transistor formed in the p-type semiconductor region; and an p-channel metal insulator semiconductor field effect transistor formed in the n-type semiconductor region, and wherein the n-channel metal insulator semiconductor field effect transistor includes: an n-type source region and an n-type drain region formed in the p-type semiconductor region separately; a first channel region formed in the p-type semiconductor region and between the n-type source region and the n-type drain region; a first gate electrode formed on the first channel region; a first region formed of $Si_{1-x}C_x$ overlapping the n-type source region and having a carbon concentration enough to increase an energy gap therein beyond that in the first channel region, and a hetero-junction surface formed between the first region formed of $Si_{1-x}C_x$ and the other portion of the p-type semiconductor region on the side of the first channel region existing at an interface between the n-type source region and the first channel region or in the vicinity thereof; and wherein a p-channel metal insulator semiconductor field effect transistor includes: a p-type source region and a p-type drain region formed in the n-type semiconductor region separately; a second channel region formed in the n-type semiconductor region and between the p-type source region and the p-type drain region; a second gate electrode formed on the second channel region; a second region formed of the $Si_{1-x}C_x$ overlapping the p-type source region and having a carbon concentration enough to increase an energy gap therein beyond that in the second channel region, and a hetero-junction surface formed between the second region formed of $Si_{1-x}C_x$ and the other portion of the n-type semiconductor region on the side of the second channel region existing at an interface between the p-type source region and the second channel region or in the vicinity thereof.

Further, the third aspect of the present invention provides a semiconductor device having a metal insulator semiconductor field effect transistor, comprising: a silicon substrate having a semiconductor region on a surface thereof; a source region and a drain region formed in the semiconductor region separately; a channel region formed in the semiconductor region and between the source region and the drain region; a gate electrode formed on the channel region; a region formed of $Si_{1-x}C_x$ overlapping at least one region of the source region and the drain region and having a carbon concentration enough to increase an energy gap therein beyond that in the channel region; and an electrode formed of metal and formed on the at least one region; and wherein the metal insulator semiconductor field effect transistor is constructed in such a way that a concentration distribution of carbon atoms beginning from an interface between the at least one region and the electrode formed thereon along a depth direction of the substrate becomes the maximum in the substrate.

Further, the fourth aspect of the present invention provides a semiconductor device having a metal insulator semiconductor field effect transistor, comprising: a silicon-on-insulator substrate having a semiconductor layer formed of silicon on an insulating substance formed on a surface thereof; a source region and a drain region formed in the semiconductor layer separately; a channel region formed in the semiconductor layer and between the source region and the drain region; a gate electrode formed on the channel region; and a region formed of $Si_{1-x}C_x$ in the drain region and having a carbon concentration enough to increase an energy gap therein beyond that in the channel region, and wherein the metal insulator semiconductor field effect transistor is constructed in such a way that a hereto-junction surface formed between the region formed of $Si_{1-x}C_x$ and the other portion of the semiconductor layer exists on the drain region side of the channel region.

Further, the fifth aspect of the present invention provides a method of manufacturing a semiconductor device, comprising the steps of: forming a gate insulating film on a silicon substrate; forming a gate electrode on the formed gate insulating film; forming a $Si_{1-x}C_x$ layer by implanting carbon ions by use of the gate electrode as a mask; and forming a source region and a drain region.

Further, the sixth aspect of the present invention provides a method of manufacturing a semiconductor device, comprising the steps of: forming a gate insulating film on a silicon layer of a silicon-on-insulator substrate, the substrate having the silicon layer on an insulating substance formed on a surface thereof; forming a gate electrode on the formed gate insulating film; forming a source region and a drain region; and forming a $Si_{1-x}C_x$ layer by implanting carbon ions by use of the gate electrode as a mask, at such an inclined implantation angle that the $Si_{1-x}C_x$ layer formed on the drain region side extends to the channel region side formed in the silicon layer and under the gate electrode.

In the first and second aspects of the present invention, since there exists an energy difference of carriers in the hetero-junction between the source and the channel, when the device is microminiaturized, a non-steady carrier transport occurs in the high electric field region between the source and the channel. As a result, the carrier speed overshoots and thereby the semiconductor device can be operated at a higher speed.

Further, in the third aspect of the present invention, since the concentration distribution of the carbon atoms beginning from the interface between the diffusion layer region formed with the $Si_{1-x}C_x$ region and the electrode formed on this diffusion layer region along the substrate depth direction is so determined as to be maximized within the substrate, the carbon concentration in the vicinity of the interface between the electrode and the diffusion layer region can be reduced, so that it is possible to suppress an increase of the contact resistance due to carbon introduction, so that the semiconductor device can operated at a higher speed.

Further, in the fourth aspect of the present invention, since the hetero-junction surface exists on the drain region side of the channel region, the large band gap region extends to the channel region and further the kinetic energy of the carriers is reduced at the drain end. As a result, the impact ionization rate in the vicinity of the drain region and the inter-band tunnel current can be reduced, so that the deterioration of the drain breakdown voltage can be prevented.

Further, in the fifth aspect of the present invention, since the $Si_{1-x}C_x$ layer can be formed in the source region, there exists an energy difference of carriers in the hetero-junction between the source and the channel. Accordingly, when the device is microminiaturized, a non-steady carrier transport occurs in the high electric field region between the source and the channel. As a result, the carrier speed overshoots and thereby the semiconductor device can be operated at a higher speed.

Further, in the sixth aspect of the present invention, since the hetero-junction surface can be formed on the drain region side of the channel region, the large band gap region extends to the channel region and further the kinetic energy of the carriers is reduced at the drain end. As a result, the impact ionization rate in the vicinity of the drain region and the inter-band tunnel current can be reduced, so that the deterioration of the drain breakdown voltage can be prevented.

BRIEF DESCRIPTION OF THE DRAWINGS

FIG. 1(a) is a cross-sectional view showing a first embodiment of the first aspect of the semiconductor device according to the present invention;

FIG. 1(b) shows a diagram showing an energy band in the vicinity of the substrate surface of the same semiconductor device shown in FIG. 1(b);

FIG. 6A is a cross-sectional view showing a first modification of the second embodiment of the first aspect of the semiconductor device;

FIG. 6B is a cross-sectional view showing a second modification of the second embodiment of the first aspect of the semiconductor device;

DETAILED DESCRIPTION OF THE PREFERRED EMBODIMENTS

Figure 2A:
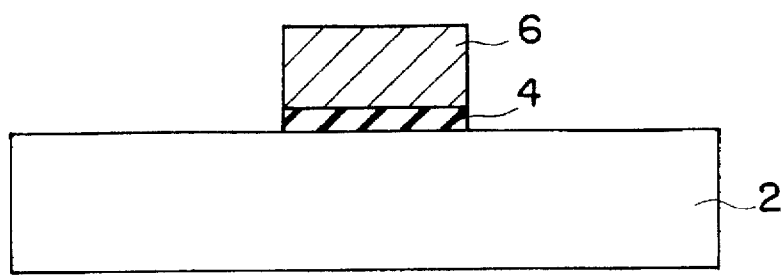
FIGS. 2A to 2C are cross-sectional views showing the manufacturing steps of the first embodiment of the first aspect of the semiconductor device shown in FIG. 1(b)

Some embodiments of the semiconductor device according to the present invention will be described hereinbelow with reference to the attached drawings.

FIG. 1 shows a first embodiment of the first aspect of the semiconductor device of n-channel MOSFET according to the present invention. FIG. 1(a) shows a cross section of the MOSFET, and FIG. 1(b) shows the energy band in the vicinity of the substrate surface of the MOSFET. In the MOSFET of the first embodiment, a gate insulating film 4 having a thickness of 5 nm is formed on a p-type silicon substrate 2, and a gate electrode 6 formed of poly silicon and having a thickness of 200 nm is formed on this gate insulating film 4. Further, a mixed crystal layer 8a/8b formed of $Si_{1-x}C_x$ (e.g., $x=\frac{1}{7}$) is formed in the vicinity of the surface of a source/drain region of the semiconductor substrate 2, respectively. Further, an $n^+$ diffusion layer 10a/10b formed as the source/drain region is formed in the substrate 2 at a position deeper than the mixed crystal layer 8a/8b. Further, it is possible to form the $n^+$ diffusion layer 10a/10b at a position the same depth as or at a position shallower than the depth of the mixed crystal layer 8a/8b. Further, the interface (pn junction surface) between the source side $n^+$ diffusion layer 10a and the channel is so formed as to match a hetero-junction surface between the $Si_{1-x}C_x$ layer 8a and the silicon substrate 2.

Further, in the MOSFET of this embodiment, the interface (pn junction surface) between the drain side $n^+$ diffusion layer 10b and the channel is also so formed as to match a hetero junction surface between the $Si_{1-x}C_x$ layer 8b and the silicon substrate 2. In the symmetrical structure as described above, the source region and the drain region can be used as they are, even if reversed with respect to each other.

Figure 2B:
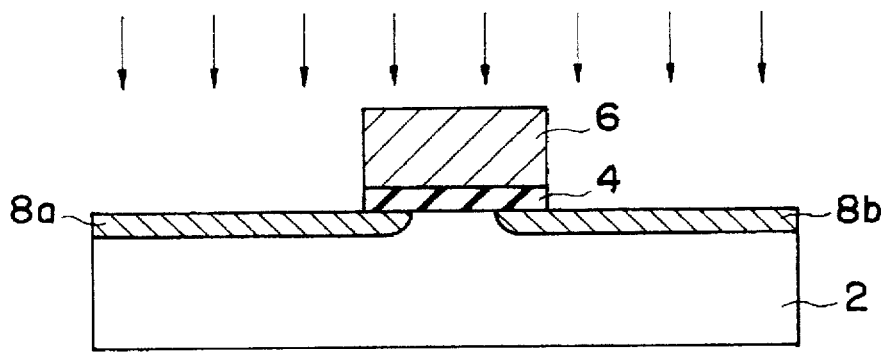
Figure 2C:
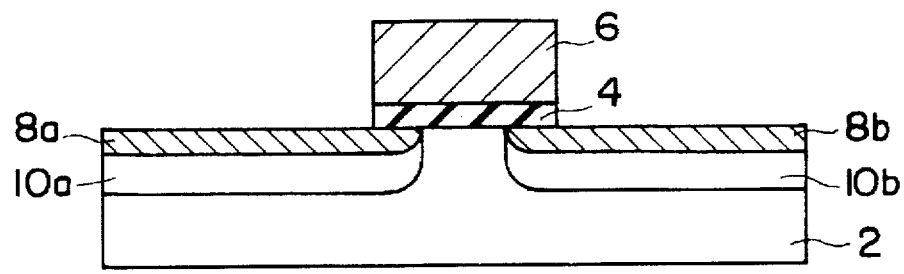

The MOSFET of this embodiment can be manufactured in accordance with the steps as shown in FIGS. 2A to 2C. First, as shown in FIG. 2A, the insulating film having a thickness of 5 nm and the poly silicon film are formed in sequence on the p-type silicon substrate 2. Further, the gate insulating film 4 and the gate electrode 6 are both formed by patterning these formed films. After that, by use of the gate electrode 6 as a mask, carbon ions are implanted in the source and drain forming regions at a dose of $0.18 \times 10^{18}$ cm$^{-2}$ under the condition that the substrate temperature is kept at about 950° C. This ion implantation at a high temperature serves to prevent the crystals in the substrate from being broken.

After that, as shown in FIG. 2B, the substrate is annealed at 1400° C. for about 90 min for crystallization, to form the mixed crystal layer 8a/8b of $Si_{1-x}C_x$ ($x=\frac{1}{7}$) on the surface of the substrate 2.

Further, as shown in FIG. 2C, the substrate is kept at 700° C., and further by use of the gate electrode 6 as a mask, nitrogen (N) ions are implanted at a dose of $2.3 \times 10^{15}$ cm$^{-2}$. After that, the substrate is annealed to form the $n^+$ diffusion layer 10a/10b having a concentration of $1 \times 10^{21}$ cm$^{-3}$.

In general, since the electron affinity (a difference in energy between the vacuum level and the conduction band level) of the $Si_{1-x}C_x$ layer 8a/8b is smaller than the electron affinity of silicon for constructing the substrate 2, the energy band diagram in the vicinity of the substrate surface of the MOSFET of this embodiment becomes as shown in FIG. 1(b). In more detail, an energy difference $\Delta E_1$ between the vacuum level and the conduction band in the source region surface (i.e., the $Si_{1-x}C_x$ layer surface) is smaller than an energy difference $\Delta E_2$ between the vacuum level and the conduction band in the channel (i.e., the silicon substrate). Further, the same can be applied to the drain side.

Figure 3:
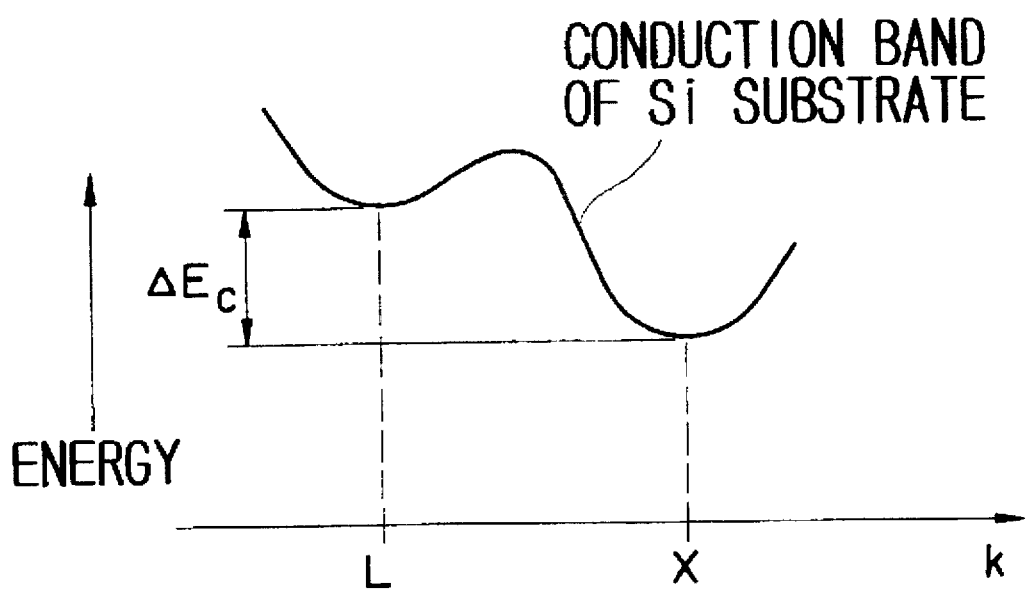
FIG. 3 is a graphical representation showing the characteristics in k-space of the conduction band of a silicon substrate.

Further, the MOSFET of this embodiment is constructed in such a way that the difference ($=\Delta E_2-\Delta E_1$) between $\Delta E_2$ and $\Delta E_1$, that is, an energy gap in carriers in the hetero-junction surface of the MOSFET is smaller than an energy difference $\Delta E_c(=1V)$ (as shown in FIG. 3) between the first lowest minimum point (point X) and the second lowest minimum point (point L) of the electron energy of the conduction band in the k-space (momentum space) of silicon for constituting the substrate 2.

In the MOSFET constructed as described above, since there exists an energy difference ($=\Delta E_2-\Delta E_1$) in the hetero-junction between the source and the channel, a non-steady carrier transport phenomenon occurs in the high electric field region between the source and the channel, so that the carriers overshoot and thereby the device can operate at a high speed. Further, since the non-steady phenomenon occurs more markedly with increasing energy difference, the device can be operated at a more higher speed with increasing energy difference.

Further, since the carrier energy difference ($=\Delta E_2-\Delta E_1$) is smaller than the energy difference $\Delta E_c$ between the first lowest minimum point (point X) and the second lowest minimum point (point L) in the k-space (momentum space) of the semiconductor substrate 2, it is possible to prevent the reduction of carrier speed due to the transition between the band valleys and the deterioration of carrier mobility due to an increase of the effective mass.

Further, in the above-mentioned embodiment, although the n-channel MOSFET has been explained, the high speed operation can be attained in the p-channel MOSFET. In the case of the p-channel MOSFET, however, it is necessary that the semiconductor device has such a hetero-junction in the interface between the source and the channel that the maximum energy of the valence band on the source side is smaller than that on the channel side when seen from the vacuum side. Further, in this case, the source and drain region 10a/10b is formed by use of aluminum, instead of nitrogen.

Further, in the above-mentioned embodiment, although the hetero-junction is a combination between the $Si_{1-x}C_x$ layer and silicon, it is possible to obtain the same effect when a semiconductor having an electron affinity smaller than that of the substrate is formed on the surface of the semiconductor substrate and in the source and drain regions.

Further, in contrast with this, it is possible to obtain the same effect when a semiconductor having an electron affinity larger than that of the material for forming the source and drain regions is used for the channel region. In this case, for instance, a $Si_{1-x}Ge_x$ layer can be formed in the channel region.

Figure 4A:
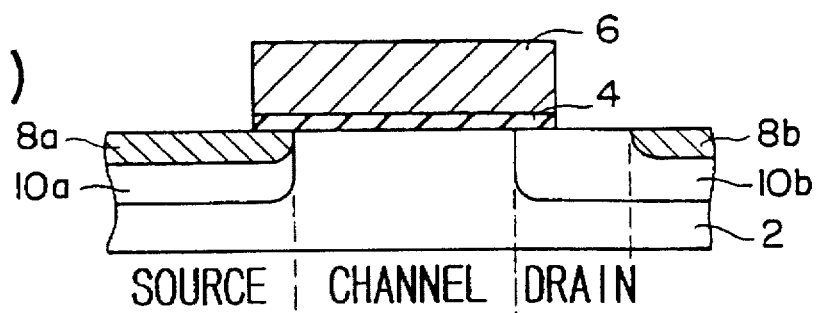
FIG. 4(a) is a cross-sectional view showing a second embodiment of the first aspect of the semiconductor device according to the present invention.
Figure 4B:
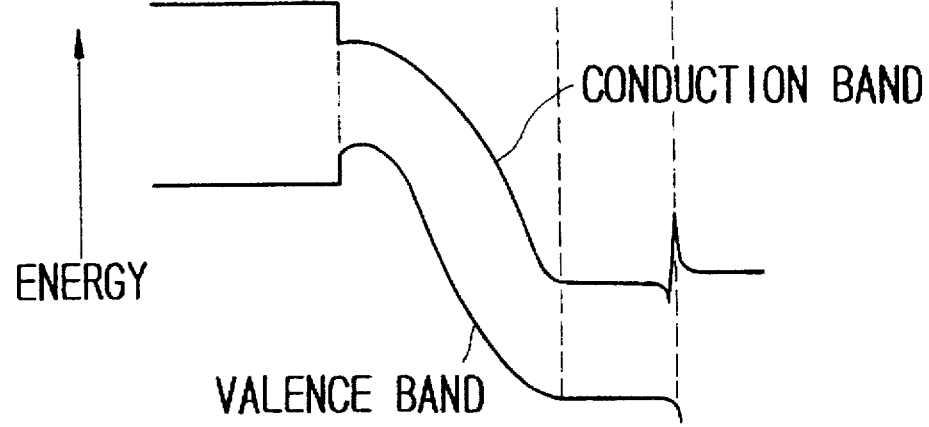
FIG. 4(b) is a diagram showing an energy band in the vicinity of the substrate surface of the same semiconductor device shown in FIG. 4(a)
Figure 5A:
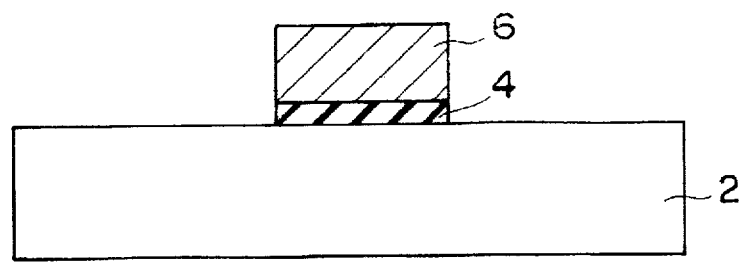
FIGS. 5A to 5C are cross-sectional views showing the manufacturing steps of the second embodiment of the first aspect of the semiconductor device shown in FIG. 4(a)
Figure 5B:
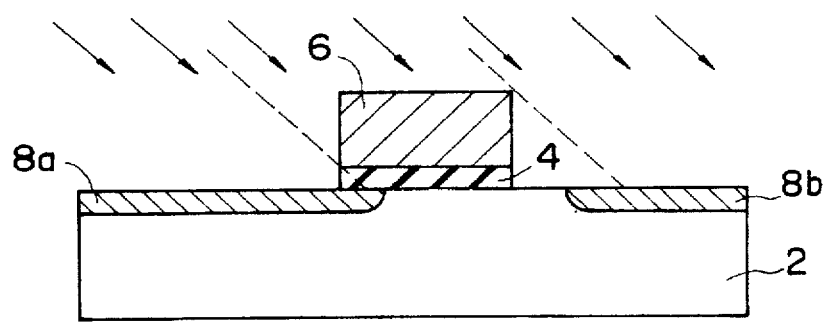
Figure 5C:
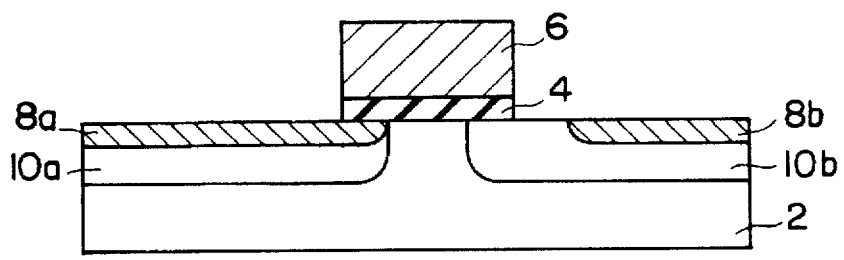

FIG. 4 shows a second embodiment of the first aspect of the semiconductor device of n-channel MOSFET according to the present invention. FIG. 4(a) shows a cross section of the MOSFET, and FIG. 4(b) shows the energy band in the vicinity of the substrate surface of the MOSFET shown in FIG. 4(a). In the MOSFET of this second embodiment, the $Si_{1-x}C_x$ layer 8b is formed a distance away from the gate electrode 6, when compared with the first embodiment of the semiconductor device shown in FIG. 1(b). The semiconductor device shown in FIG. 4(a) can be manufactured in accordance with the process as shown in FIGS. 5A to 5C. That is, the feature of this manufacturing method is to implant carbon ions onto the substrate 2 at an angle with respect to the substrate surface, as shown in FIG. 5B, without implanting carbon ions perpendicularly to the substrate. Further, the manufacturing process shown in FIGS. 5A to 5C is the same as with the case of the first embodiment shown in FIGS. 2A to 2C, excepting the carbon ion implanting step shown in FIG. 5B.

In the second embodiment of the MOSFET according to the present invention, since the $Si_{1-x}C_x$ layer 8b is formed on the drain side a distance away from the interface (pn junction surface) between the channel and the drain region 10a, the energy band on the substrate surface can be shown in FIG. 4(b). In more detail, there exists a sharp peak portion in the hetero-junction surface between the $Si_{1-x}C_x$ layer 8b and the substrate 2. Accordingly, carriers can pass through the hetero-junction surface, without largely reducing the kinetic energy thereof due to a tunnel effect, so that it is possible to realize still higher speed operation, as compared with the MOSFET of the first embodiment. In this case, it is preferable that the hetero-junction surface exists outside of a depletion layer formed on the drain side when the MOSFET operates, and in the drain region 10b in the direction through the source and drain region 10a/10b.

Further, in the above-mentioned first and second embodiments, although nitrogen (N) is used to form the $n^+$ diffusion layer 10a/10b of the n-channel MOSFET, it is also possible to use another donor element such as As. However, the activation rate of the $Si_{1-x}C_x$ layer 8a/8b can be increased when N is used.

FIG. 6A shows a first modification of the second embodiment of the first aspect, and FIG. 6B shows a second modification of the second embodiment of the first aspect of the semiconductor device according to the present invention.

In more detail, in the MOSFET of the second embodiment shown in FIG. 4(a), although the hetero-junction surface between the $Si_{1-x}C_x$ layer 8a and the substrate 2 matches the pn junction surface between the source region 10a and the channel on the source side, it is possible to obtain the same effect in either case where the hetero-junction surface between the $Si_{1-x}C_x$ layer 8a and the substrate 2 is formed extending deep into the channel region as shown in FIG. 6A or formed extending deep into the source region as shown in FIG. 6B. In this case, it is preferable that the hetero-junction surface exists inside of a depletion layer formed on the source side when the MOSFET operates, in the direction through the source and drain region 10a/10b.

Further, when the hetero-junction surface is formed on the source side, it is possible to realize a high speed operation, even if the hetero-junction surface is not formed on the drain side.

Further, in the above-mentioned embodiments, although the MOSFET of bulk structure has been explained, the above-mentioned embodiments can be applied to the MOSFET of SOI (Silicon on Insulator) structure.

A second aspect of the MOSFET according to the present invention will be described hereinbelow with reference to FIGS. 7A to 7C. In this second aspect, the MOSFET is formed as an n-channel MOSFET of SOI structure, which can be manufactured in accordance with the process as shown in FIGS. 7A to 7C.

Figure 7A:
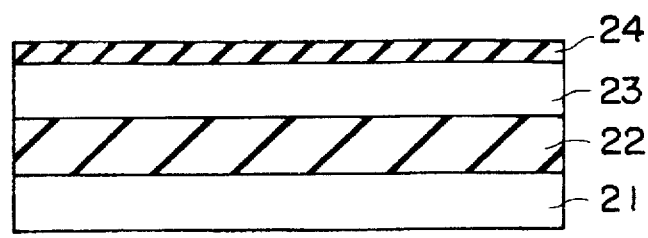
FIGS. 7A to 7C are cross-sectional views showing a method of manufacturing the semiconductor device of SOI structure (the second aspect) according to the present invention.

As shown in FIG. 7A, a buried oxide film 22 is first formed on a substrate 21. After that, a p-type silicon layer 23 is formed on the formed oxide film 22, and then the surface of the formed layer 23 is heated for thermal oxidization, to form an oxide film 24 having a thickness of 5 nm.

Figure 7B:
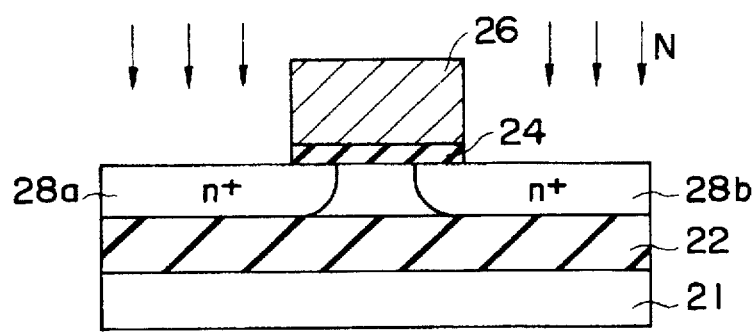

Successively, as shown in FIG. 7B, a gate electrode 26 is formed on the oxide film 24 by depositing a poly silicon film and further by patterning the deposited film. Further, nitrogen ions are implanted to form an $n^+$ layer 28a/28b as a source/drain region, by use of the formed gate electrode 26 as a mask.

Figure 7C:
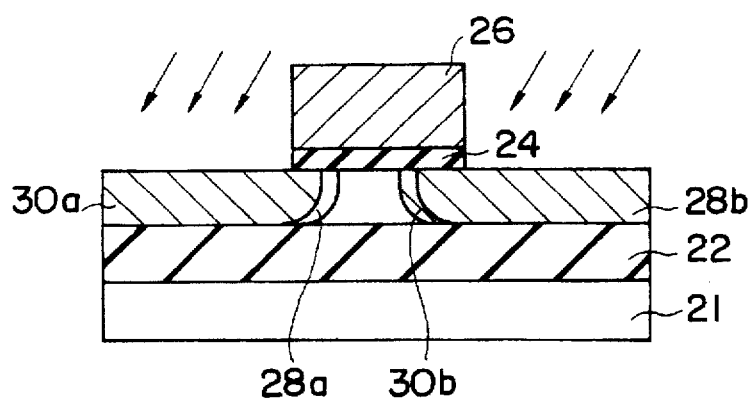

Further, as shown in FIG. 7C, carbon ions are implanted by use of the gate electrode 26 as a mask at an angle with respect to the substrate, and then annealed to form a $Si_{1-x}C_x$ layer 30a/30b. Under these conditions, the $Si_{1-x}C_x$ layer 30b formed on the drain side extends to the channel side; on the other hand, the $Si_{1-x}C_x$ layer 30a formed on the source side extends to the source region 28a, respectively. It is preferable that the hereto-junction on the drain side exists inside of a depletion layer formed on the drain side when the MOSFET operates, in the direction through the source and drain region 28a/28b.

Here, when the band gap is denoted by Eg; the Boltzmann/'s constant is denoted by k; and the electron temperature is denoted by Te, since the impact ionization rate can be expressed as $$\exp(-3Eg/(2k\ Te))$$

Therefore, when carbon ions are implanted onto the $n^+$ region 28b to be formed as the drain region, since the region of a large band gap $E_g$ extends to the channel region and further since the kinetic energy of carriers on the drain end can be reduced, it is possible to reduce the impact ionization rate and the inter-band tunnel current in the vicinity of the drain, with the result that the deterioration of the drain breakdown voltage can be prevented.

Further, in this second aspect of the present invention, since the $Si_{1-x}C_x$ layer 30a is formed on the source side, it is possible to realize a high speed operation in the same way as with the case of the first and second embodiments of the first aspect of the present invention.

Further, in both the first and second aspects according to the present inventions, although the $Si_{1-x}C_x$ layer is formed by ion implantation, it is possible to from the same layer by selectively epitaxial-growing graphite as a solid source and $SiH_4$ as a source at 450° C. in accordance with MBE (Molecular Beam Epitaxy) technique.

Here, prior to the description of a third embodiment of the first aspect of the semiconductor device according to the present invention, some problems caused when a metal contact is formed on the $Si_{1-x}C_x$ layer formed on a silicon substrate will be explained hereinbelow.

In general, when a metal contact is formed on a semiconductor substrate, the contact resistance Rc can be expressed as $$Rc=\alpha \cdot exp(\phi_{bn}/Nd^{1/2}) \quad (1)$$

where Nd denotes the impurity concentration of the diffusion layer. Further, when a metal work function is denoted by $\phi_m$ and the electron affinity of the semiconductor substrate is denoted by $\chi$, $\phi_{bn}$ can be expressed as $$\phi_{bn}=\phi_m-\chi \quad (2)$$

Further, since the electron affinity $\chi$ of the $Si_{1-x}C_x$ layer used for the first and second aspect of the present invention is small, as compared with that of the silicon substrate, when the metal contact is formed on the $Si_{1-x}C_x$ layer, as understood on the basis of the above expressions (1) and (2), there exists a problem in that the contact resistance Rc increases so that the high speed operation is difficult to obtain.

This problem can be solved by a third embodiment of the first aspect of the semiconductor device according to the present invention.

Figure 8:
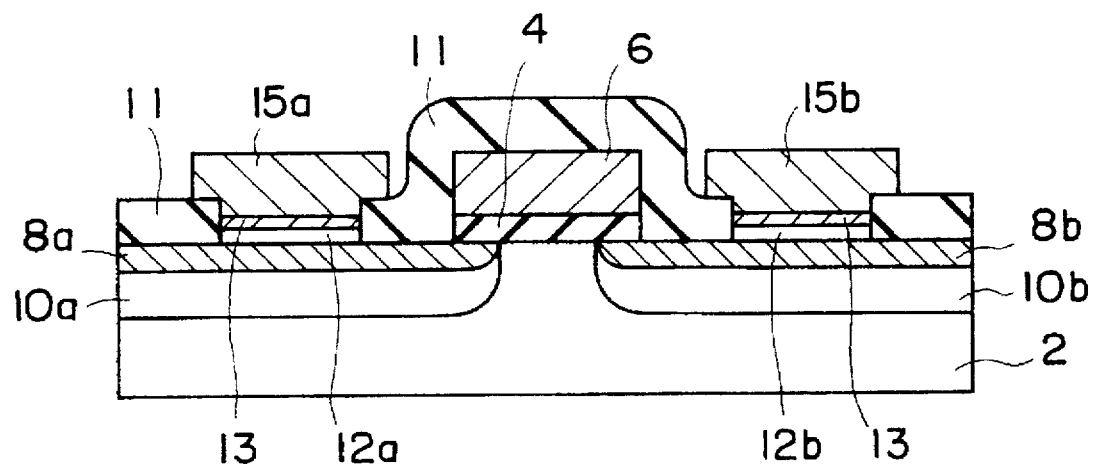
FIG. 8 is a cross-sectional view showing a third embodiment of the first aspect of the semiconductor device according to the present invention.

This third embodiment will be described hereinbelow with reference to FIG. 8. The semiconductor device of this third embodiment is of surface-channel type MOSFET formed in the same way as with the case of the first embodiment of the first aspect according to the present invention shown in FIG. 1. Being different from the first embodiment, however, a silicon epitaxial layer 12a/12b of the same conductivity type of that of the source/drain region 10a/10b is formed between the $Si_{1-x}C_x$ layer 8a/8b formed in the vicinity of the surface of the source/drain region 10a/10b and a source/drain electrode 15a/15b formed of a metal (e.g., Al). The silicon epitaxial layer 12a/12b is formed in two holes formed in an inter-layer insulating film 11 so as to be connected to the source and drain 10a and 10b, respectively in accordance with CVD technique.

Further, a barrier film 13 is formed between the silicon epitaxial layer 12a/12b and the electrode 15a/15b, in order to prevent silicon from being diffused from the Al electrode 15a/15b.

In this third embodiment of the first aspect of the semiconductor device according to the present invention, since a silicon semiconductor layer 12a/12b having an electron affinity larger than that of the $Si_{1-x}C_x$ layer 8a/8b is formed between the $Si_{1-x}C_x$ layer 8a/8b and the electrode 15a/15b, almost no carbon ions exist in the vicinity of the interface of the electrode 15a/15b, so that contact resistance can be reduced and thereby a high speed operation can be realized.

A fourth embodiment of the first aspect of the semiconductor device according to the present invention will be described hereinbelow with reference to FIG. 9.

In this fourth embodiment, in the surface-channel type MOSFET formed in the same way as with the case of the first embodiment of the first aspect of the present invention shown in FIG. 1, the $Si_{1-x}C_x$ layer 8a/8b is formed in the source/drain region 10a/10b in such a way as to be shallow in the vicinity of the channel but deep in the vicinity of the source/drain electrode 15a/15b. Further, a siliside film $14_1/14_2$ is formed on the source/drain region 10a/10b and the gate electrode 6, respectively, and further the electrode 15a/15b is formed via the siliside film $14_1$.

Owing to the construction as described above, it is possible to reduce the concentration of the $Si_{1-x}C_x$, that is, the carbon concentration at the interface between the source/drain electrode 15a/15b or the siliside layer 14 and the source/drain region 10a/10b (e.g., less than $1 \times 10^{21}$ $cm^{-3}$), so that the electron affinity $\chi$ of the semiconductor layer (source/drain region) in the above-mentioned interface can be roughly equalized to that of silicon. As a result, the contact resistance can be reduced, and thereby a high speed operation can be realized.

Further, in the semiconductor device of this fourth embodiment, since the siliside film $14^2$ of a low resistance is formed on the gate electrode 6, the gate resistance can be also reduced and thereby the operation speed can be further improved.

The method of manufacturing a fourth embodiment of the first aspect of the semiconductor device according to the present invention will be described hereinbelow with reference to FIGS. 10A to 10C.

Figure 10A:
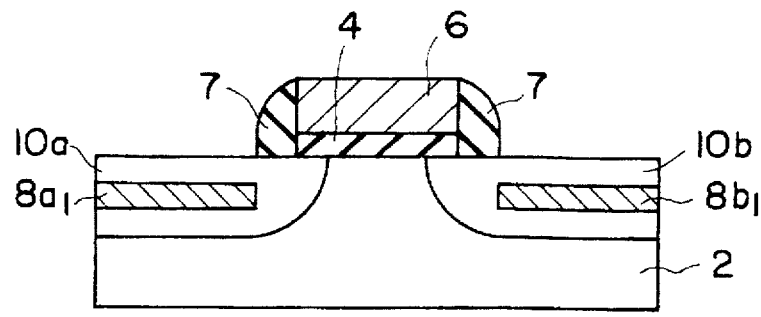
FIGS. 10A to 10C are cross-sectional views showing the manufacturing steps of the fourth embodiment of the first aspect of the semiconductor device according to the present invention.
Figure 10B:
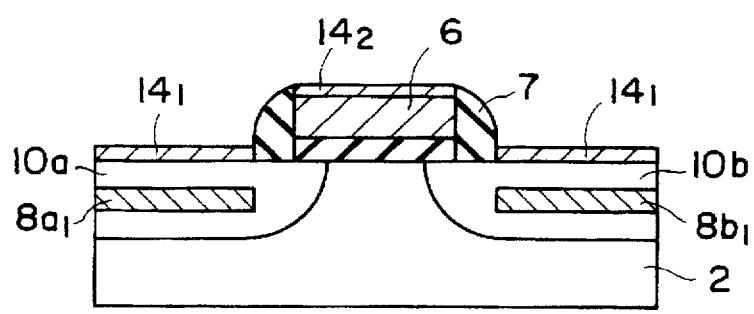

As shown in FIG. 10A, first a gate electrode composed of a gate insulating film 4 and a poly silicon film 6 is formed on a silicon substrate 2. After that, ions are implanted by use of the formed gate electrode as a mask, to form the source/drain region 10a/10b. Successively, a side wall 7 (e.g., formed of a nitride film) is formed on the side portion of the gate electrode, and then carbon ions are implanted deep at a dose of $1 \times 10^{16}$ $cm^{-2}$ and at an acceleration voltage of 10 keV by use of the side wall 7 as a mask, to form a $Si_{1-x}C_x$ layer $8a_1/8b_1$, in the source/drain region 10a/10b (See FIG. 10A).

Successively, a high melting point metal film e.g., Ti) is deposited all over the surface of the substrate and then heat-treated under a predetermined condition, to form a siliside film $14_1/14_2$ having a thickness of 40 nm on the source/drain region 10a 10b and the gate electrode 6.

Figure 10C:
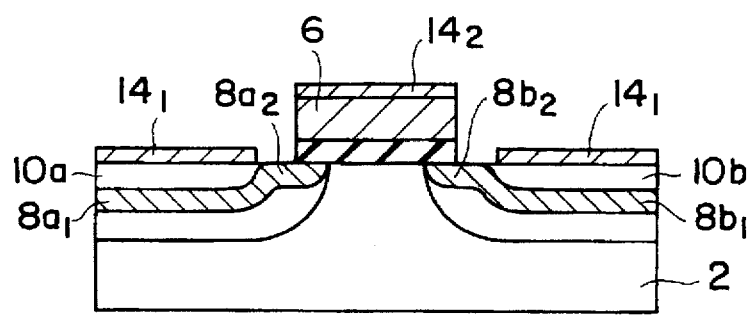

After the side wall 7 has been removed, carbon ions are further implanted shallow at a dose of $1 \times 10^{16}$ $cm^{-2}$ and at an acceleration voltage of 60 keV, to form a shallow $Si_{1-x}C_x$ layer $8a_2/8b_2$, in the vicinity of the channel of the source drain region 10a/10b (See FIG. 10C).

Figure 9:
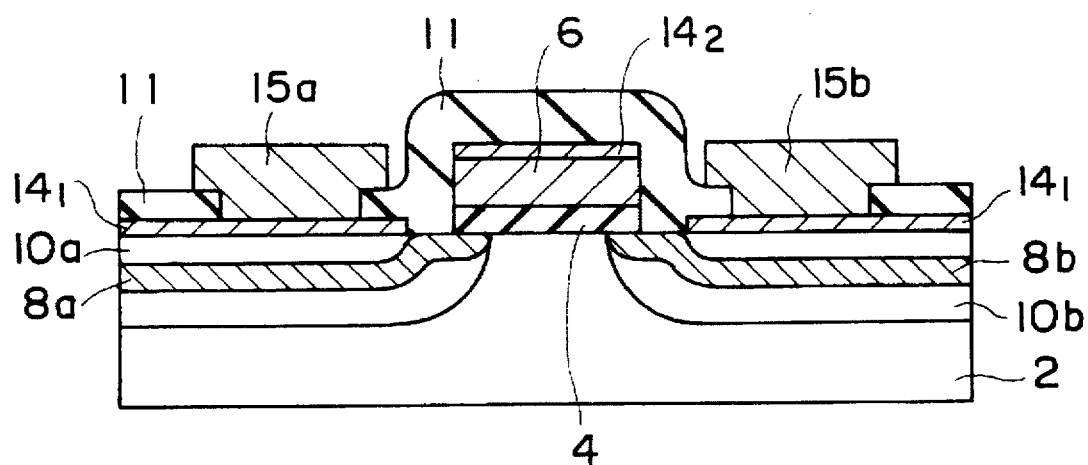
FIG. 9 is a cross-sectional view showing a fourth embodiment of the first aspect of the semiconductor device according to the present invention.

Further, after an inter-layer insulating film 11 (as shown in FIG. 9) has been deposited, two connection holes are formed; a metal film (e.g., Al) is buried; and the drain electrode 15a/15b is formed by patterning the metal film.

Figure 11:
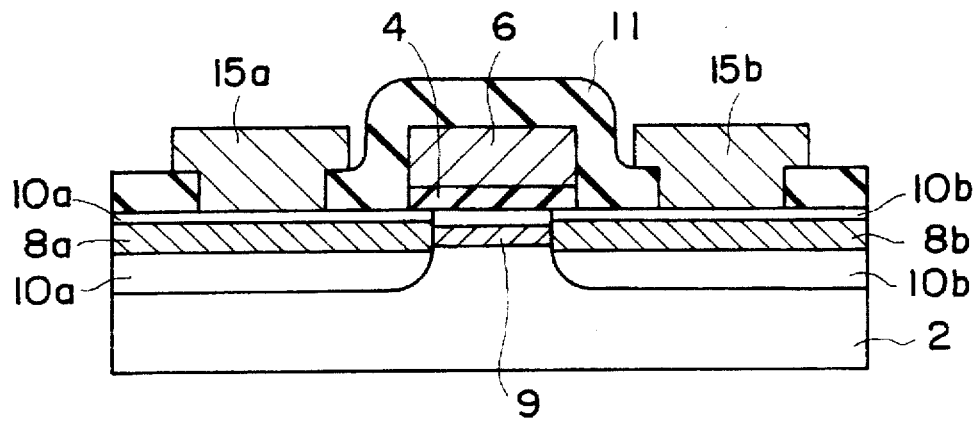
FIG. 11 is a cross-sectional view showing a fifth embodiment of the first aspect of the semiconductor device according to the present invention.

A fifth embodiment of the first aspect of the semiconductor device according to the present invention will be described hereinbelow with reference to FIG. 11. This embodiment is of buried channel type MOSFET, in which the $Si_{1-x}C_x$ layer 8a/8b is formed deep in the source/drain region 10a/10b so as to be connected to an impurity layer 9 formed in the silicon substrate 2 and used as the buried channel. Further, the carbon concentration of the $Si_{1-x}C_x$ layer 8a/8ab is so determined that the energy gap of the $Si_{1-x}C_x$ layer 8a/8b becomes higher than tat of the channel region. Therefore, a high speed operation can be realized in the same way as with the case of the first embodiment of the first aspect of the semiconductor device according to the present invention.

Further, since the $Si_{1-x}C_x$ layer 8a/8b is formed deep in the source/drain region 10a/10b, in the interface between the source/drain electrode 15a/15b and the source/drain region 10a/10b, the concentration of the $Si_{1-x}C_x$ layer, that is, the carbon concentration can be reduced. As a result, the contact resistance can be reduced and thereby a high speed operation can be realized.

Figure 12:
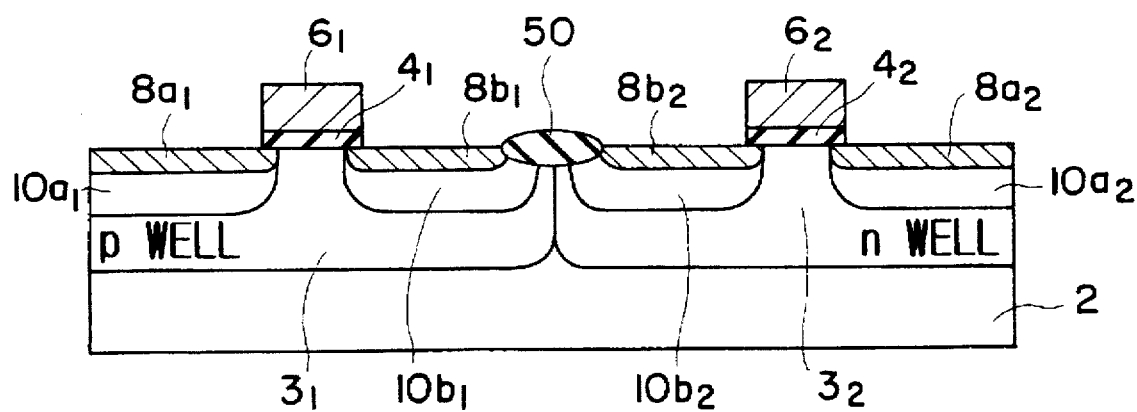
FIG. 12 is a cross-sectional view showing a sixth embodiment of the first aspect of the semiconductor device according to the present invention.
Figure 13A:
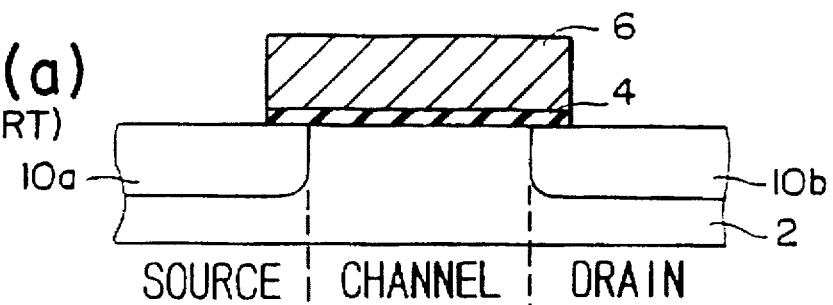
FIG. 13(a) is a cross-sectional view showing a prior art MOSFET of planar structure.
Figure 13B:
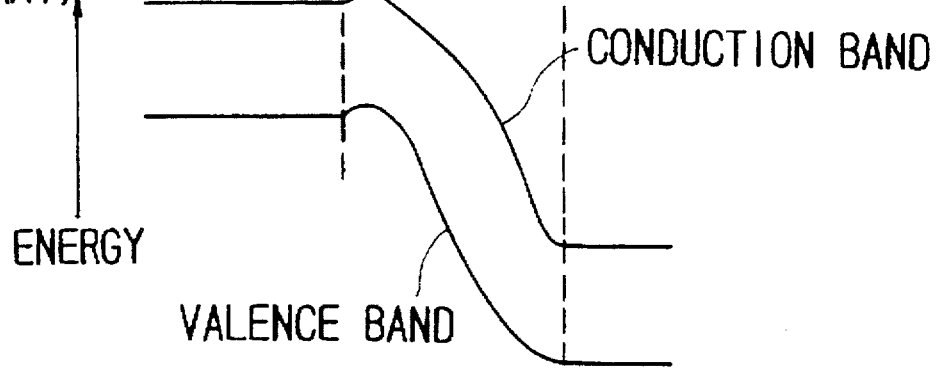
FIG. 13(b) is a diagram showing an energy band in the vicinity of the substrate surface of the prior art MOSFET shown in FIG. 13(a)
Figure 14:
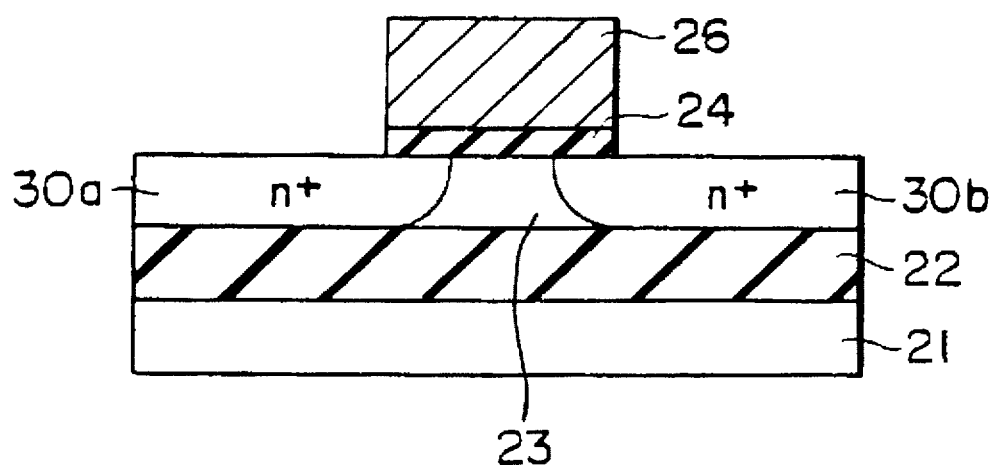
FIG. 14 is a cross-sectional views showing a prior art MOSFET of SOI structure.

A sixth embodiment of the first aspect of the semiconductor device according to the present invention will be described hereinbelow with reference to FIG. 12. This embodiment is of complementary type MOSFET, in which a p well $3_1$ and an n well $3_2$ are formed in a semiconductor substrate 2 in such a way as to be separated from each other by an element separating insulating film 50. A gate electrode $6_1$ is formed on the p well $3_1$ via a gate insulating film $4_1$, and a gate electrode $6_2$ is formed on the n well $3_2$ via a gate insulating film $4_2$. Further, an n type source region $10a_1$ and an n type drain region $10b_1$ are formed in the p well $3_1$ by use of a gate electrode $6_1$ as a mask. In the same way, a p type source region $10a_2$ and a p type drain region $10b_2$ are formed in the n well $3_2$ by use of a gate electrode $6_2$ as a mask.

Further, in the source region $10a_1$ and the drain region $10b_1$ of an N-channel transistor, there are formed two $Si_{1-x}C_x$ layers $8a_1$ and $8b_2$ each having such a carbon concentration that the energy gap thereof becomes lager than that in the channel region.

Therefore, the n-channel transistor and the p-channel transistor can be operated at a high speed in the same way as with the case of the first embodiment of the first aspect of the semiconductor device according to the present invention.

As described above, in the first aspect of the semiconductor device according to the present invention, it is possible to realize a high speed operation, even if microminiaturized.

As described above, in the second aspect of the semiconductor device according to the present invention, it is possible to prevent the drain breakdown voltage from being deteriorated.

As described above, in the method of manufacturing the semiconductor device (the third aspect) according to the present invention, it is possible to realize a high speed operation, even if microminiaturized.

As described above, in the method of manufacturing the semiconductor device (the fourth aspect) according to the present invention, it is possible to prevent the drain breakdown voltage from being deteriorated.

What is claimed is:

1. A semiconductor device having a metal insulator semiconductor field effect transistor, comprising:

a silicon substrate having a semiconductor region on a surface thereof;

a source region and a drain region formed in the semiconductor region;

a channel region formed in the semiconductor region between the source region and the drain region;

a gate electrode formed on the channel region;

a region formed of $Si_{1-x}C_x$ overlapping the source region and having a carbon concentration to increase an energy gap therein beyond that in the channel region;.and a hetero-junction surface formed between the region formed of $Si_{1-x}C_x$ and the semiconductor region on the side of the channel region, said hetero-junction surface being located at an interface between the source region and the channel region or and partially overlapping the gate electrode.

2. The semiconductor device of claim 1, wherein the hetero-junction surface matches a pn junction surface between the source region and the channel region of the metal insulator semiconductor field effect transistor, or exists in the channel region.

3. The semiconductor device of claim 2, wherein an energy gap of carriers in the hetero-junction surface is smaller than an absolute value of an energy difference between a first lowest minimum point and a second lowest minimum point of a conduction band energy in k-space of material constituting the semiconductor region, when the metal insulator semiconductor field effect transistor is of n type, and smaller than an absolute value of an energy difference between a first highest maximum point and a second highest maximum point of a valence band energy, when the metal insulator semiconductor field effect transistor is of p type.

4. The semiconductor device of claim 3, wherein the metal insulator semiconductor field effect transistor is of bulk structure, wherein another region formed of $Si_{1-x}C_x$ having a carbon concentration enough to increase an energy gap therein beyond that in the channel region is also formed overlapping the drain region, and wherein a hetero-junction surface between the region formed of $Si_{1-x}C_x$ overlapping the drain region and the other portion of the semiconductor region is formed in the drain region.

5. The semiconductor device of claim 2, wherein the metal insulator semiconductor field effect transistor is of bulk structure, wherein another region formed of $Si_{1-x}C_x$ having a carbon concentration enough to increase an energy gap therein beyond that in the channel region is also formed overlapping the drain region, and wherein a hetero-junction surface between the region formed of $Si_{1-x}C_x$ overlapping the drain region and the other portion of the semiconductor region is formed in the drain region.

6. The semiconductor device of claim 1, wherein an energy gap of carriers in the hetero-junction surface is smaller than an absolute value of an energy difference between a first lowest minimum point and a second lowest minimum point of a conduction band energy in k-space of material constituting the semiconductor region, when the metal insulator semiconductor field effect transistor is of n type, and smaller than an absolute value of an energy difference between a first highest maximum point and a second highest maximum point of a valence band energy, when the metal insulator semiconductor field effect transistor is of p type.

7. The semiconductor device of claim 6, wherein the metal insulator semiconductor field effect transistor is of bulk structure, wherein another region formed of $Si_{1-x}C_x$ having a carbon concentration enough to increase an energy gap therein beyond that in the channel region is also formed overlapping the drain region, and wherein a hetero-junction surface between the region formed of $Si_{1-x}C_x$ overlapping the drain region and the other portion of the semiconductor region is formed in the drain region.

8. The semiconductor device of claim 1, wherein the metal insulator semiconductor field effect transistor is of bulk structure, another region formed of $Si_{1-x}C_x$ having a carbon concentration enough to increase an energy gap therein beyond that in the channel region is formed overlapping the drain region, and a hetero-junction surface between the region formed of $Si_{1-x}C_x$ overlapping the drain region and the other portion of the semiconductor region is formed in the drain region.

9. A semiconductor device comprising:

a plurality of metal insulator semiconductor field effect transistors, each comprising:

a silicon substrate having a p-type semiconductor region and an n-type semiconductor region on a surface thereof;

an n-channel metal insulator semiconductor field effect transistor formed in the p-type semiconductor region; and an p-channel metal insulator semiconductor field effect transistor formed in the n-type semiconductor region;

the n-channel metal insulator semiconductor field effect transistor comprising:

an n-type source region and an n-type drain region formed in the p-type semiconductor region;

a first channel region formed in the p-type semiconductor region and between the n-type source region and the n-type drain region;

a first gate electrode formed on the first channel region;

a first region formed of $Si_{1-x}C_x$ overlapping the n-type source region and having a carbon concentration enough to increase an energy gap therein beyond that in the first channel region; and a hetero-junction surface formed between the first region formed of $Si_{1-x}C_x$ and the p-type semiconductor region on the side of the first channel region, said hetero-junction surface being located at an interface between the n-type source region and the first channel region or in the vicinity thereof and partially overlapping the first gate electrode;

the p-channel metal insulator semiconductor field effect transistor comprising:

a p-type source region and a p-type drain region formed in the n-type semiconductor region;

a second channel region formed in the n-type semiconductor region and between the p-type source region and the p-type drain region;

a second gate electrode formed on the second channel region;

a second region formed of the $Si_{1-x}C_x$ overlapping the p-type source region and having a carbon concentration enough to increase an energy gap therein beyond that in the second channel region; and a hetero-junction surface formed between the second region formed of $Si_{1-x}C_x$ and the n-type semiconductor region on the side of the second channel region, said hetero-junction surface being located an interface between the p-type source region and the second channel region or and partially overlapping the second gate electrode.

10. A semiconductor device having a metal insulator semiconductor field effect transistor, comprising:

a silicon-on-insulator substrate having a semiconductor layer formed of silicon on an insulating substance formed on a surface thereof;

a source region and a drain region formed in the semiconductor layer;

a channel region formed in the semiconductor layer between the source region and the drain region;

a gate electrode formed on the channel region;

a region formed of $Si_{1-x}C_x$ in the drain region and having a carbon concentration to increase an energy gap therein beyond that in the channel region; and a hetero-junction surface formed between the region formed of $Si_{1-x}C_x$ and the semiconductor layer, said hetero-junction surface being located at an interface between the drain region and the channel region and partially overlapping the gate electrode.

11. A semiconductor device having a metal insulator semiconductor field effect transistor, comprising:

a silicon substrate having a semiconductor region on a surface thereof;

a source region and a drain region formed in the semiconductor region;

a channel region formed in the semiconductor region between the source region and the drain region;

a gate electrode formed on the channel region;

a region formed of $Si_{1-x}C_x$ overlapping at least one region of the source region and the drain region and having a carbon concentration to increase an energy gap therein beyond that in the channel region;

an electrode formed of metal and formed on the at least one region; and a hetero-junction surface formed between the region formed of $Si_{1-x}C_x$ and the semiconductor region, said hetero-junction surface partially overlapping the gate electrode;

wherein a concentration distribution of carbon atoms beginning from an interface between the at least one region and the electrode formed thereon along a depth direction of the substrate reaches a maximum in the silicon substrate.

12. The semiconductor device of claim 11, wherein the metal insulator semiconductor field effect transistor is of surface channel type, the region formed of $Si_{1-x}C_x$ is formed in the vicinity of a surface of the at least one region, and a silicon semiconductor layer of the same conductivity type as that of the at least one region is formed between the at least one region and the electrode formed thereon.

13. The semiconductor device of claim 12, wherein the region formed of $Si_{1-x}C_x$ is formed overlapping the source region, and the hetero-junction surface locates at an interface between the source region and the channel region or in the vicinity thereof.

14. The semiconductor device of claim 11, wherein the metal insulator semiconductor field effect transistor is of surface channel type, and the region formed of $Si_{1-x}C_x$ is formed deeper under the electrode of the at least one region than in the vicinity of the channel region.

15. The semiconductor device of claim 14, wherein the region formed of $Si_{1-x}C_x$ is formed overlapping the source region, and the hetero-junction surface locates at an interface between the source region and the channel region or in the vicinity thereof.

16. The semiconductor device of claim 11, wherein the metal insulator semiconductor field effect transistor is of buried channel type, and the region formed of $Si_{1-x}C_x$ is constructed so as to be connected to the buried channel.

17. The semiconductor device of claim 11, wherein the region formed of $Si_{1-x}C_X$ is formed overlapping the source region, and the hetero-junction surface locates at an interface between the source region and the channel region or in the vicinity thereof.

* * * * *

UNITED STATES PATENT AND TRADEMARK OFFICE
CERTIFICATE OF CORRECTION

PATENT NO.   : 5,734,181
DATED        : March 13, 1998
INVENTOR(S)  : Ryuji OHBA et al.

It is certified that error appears in the above-identified patent and that said Letters Patent is hereby corrected as shown below:

Column 11, Claim 1, line 64, wherein "the channel region or and partially overlapping the gate electrode." should read --the channel region and partially overlapping the gate electrode.--.

Signed and Sealed this

Seventh Day of March, 2000

Attest:

Q. TODD DICKINSON

Attesting Officer

Commissioner of Patents and Trademarks